United States Patent [19]

Mueller

[11] 4,099,201
[45] Jul. 4, 1978

[54] SEMICONDUCTOR RECTIFIER ASSEMBLY HAVING AN INSULATING MATERIAL THEREIN THAT EVOLVES GASES WHEN EXPOSED TO AN ARC

[75] Inventor: David Leonard Mueller, Media, Pa.

[73] Assignee: General Electric Company, Phila., Pa.

[21] Appl. No.: 786,735

[22] Filed: Apr. 11, 1977

[51] Int. Cl.² ............ H01L 23/28; H01L 23/02; H01L 23/12
[52] U.S. Cl. .................. 357/72; 357/74; 357/79; 357/81
[58] Field of Search .......... 357/72, 74, 75, 76, 357/79, 81

[56] References Cited
U.S. PATENT DOCUMENTS

| | | | |
|---|---|---|---|
| 3,414,433 | 12/1968 | Van Bramer | 357/74 |
| 3,443,168 | 5/1969 | Camp | 357/74 |
| 3,513,360 | 5/1970 | Andersson | 357/74 |
| 3,581,160 | 5/1971 | Piccone | 357/79 |
| 3,654,529 | 4/1972 | Lord | 357/79 |
| 4,007,477 | 2/1977 | Goodman | 357/74 |

Primary Examiner—Andrew J. James
Attorney, Agent, or Firm—William Freedman; Carl L. Silverman

[57] ABSTRACT

A semiconductor rectifier assembly comprises first and second electroconductive posts having portions between which a semiconductor body is sandwiched under pressure. A sealed housing for the semiconductor body comprises said posts, a hollow cylindrical insulator surrounding said semiconductor body and said post portions, and sealing means at opposite ends of the insulator for respectively forming seals between said posts and the ends of the insulator. The sealing means at one end of the insulator comprises a pair of annular metal flanges joined together at their outer peripheries. One flange is bonded adjacent its inner periphery to the insulator and the other is bonded adjacent its inner periphery to the adjacent post. A thin annular disc of electrical insulating material has a first portion adjacent its outer periphery disposed between said flanges and a second portion located radially inwardly of the first portion extending between the inner periphery of the insulator and the adjacent post. The insulating disc, when exposed to an electric arc, evolves gases that oppose motion of the arc terminal onto the metal flanges, thereby protecting the flanges from being burned through or otherwise perforatd by the arc.

10 Claims, 1 Drawing Figure

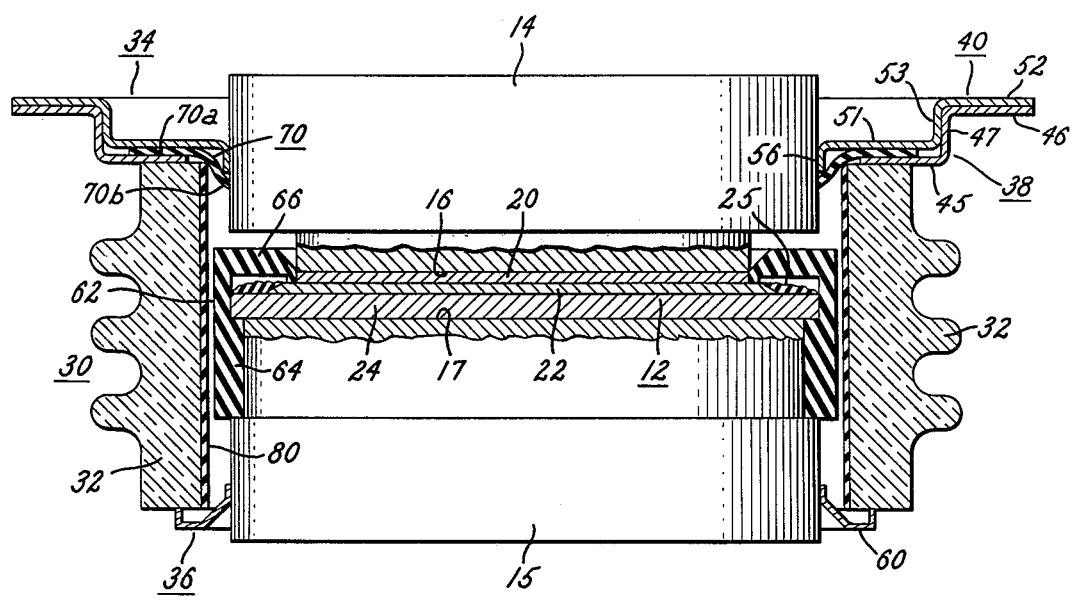

SEMICONDUCTOR RECTIFIER ASSEMBLY HAVING AN INSULATING MATERIAL THEREIN THAT EVOLVES GASES WHEN EXPOSED TO AN ARC

BACKGROUND

This invention relates to improvements in high-power rectifier assemblies including semiconductor devices of the type in which a semiconductor body, located in a sealed housing, is sandwiched under pressure between opposing electroconductive thrust members, or posts.

High-current solid-state rectifiers employing semiconductive material (e.g., silicon) are well known in the art of electric power conversion. A typical device of this kind comprises a semiconductor body in the shape of a broad-area multilayer wafer disposed between flat-surfaced thrust members, or posts, that are joined in sealed relationship to opposite ends of a hollow insulator to form a sealed housing or package for the wafer. If a two-layer (PN) silicon wafer is used, the device is a simple rectifier or diode, whereas if a four-layer (PNPN) wafer with gating means is used, the device is a controlled rectifier known in the art as a thyristor or SCR. In either case, it is common practice to support the device in a pressure assembly that provides a force urging the thrust members together and clamping the semiconductor body between the thrust members and electrically in series therewith. When properly constructed and installed, such a rectifier assembly can safely conduct continuous forward current of 250 amperes or more and brief surges of many thousands of amperes.

Even when properly designed and applied, a high-current semiconductor device may sometimes fail. There are a number of known causes for device failures, such as cyclic fatigue or excessive surge currents. The failure mechanism typically involves overheating localized areas of the silicon wafer which then lose blocking ability and permit the unimpeded flow of reverse current. In practice this will usually occur near the center of the wafer where short circuit current is well contained and will not cause permanent damage outside of the afflicted device itself. The failed device can then be replaced with a sound one, and the associated conversion apparatus can continue operating without expensive repairs or serious interruption of service. Occasionally, however, an electric arc may occur near the edge of a wafer where the housing of the device is especially vulnerable, and in this event external flashing or flame is possible with consequent propagation of the failure and widespread damage to other parts of the apparatus.

When its silicon body fails, the peak magnitude of current (having a given rate of rise and a given duration) to which a semiconductor rectifier assembly can be subjected without external flashing is herein referred to as the "explosion rating" of the assembly. Explosion ratings of 90,000 amperes and even higher are not uncommon.

One arrangement for providing such high explosion ratings is disclosed and claimed in U.S. Pat. No. 3,581,160— Piccone et al., assigned to the assignee of the present invention. The rectifier assembly of that arrangement comprises a sealed housing in which the silicon wafer is located. Such housing comprises a cylindrical insulator and sheet metal terminal, or sealing, members bonded to the insulator. The above-described occasional arc occurring at the edge of the wafer is a high current arc which can burn a hole through or otherwise perforate one of these sealing members, thereby allowing flame, sparks, or other arcing products to escape from the sealed housing. Piccone et al. prevents escape of these arcing products to the surrounding ambient by providing what amounts to a supplementary enclosure of rugged construction around portions of the housing, which enclosure is able to contain the arcing products escaping from the housing and effectively withstand the high pressures developed by such escaping arcing products. This enclosure includes relatively thick O-rings, metal back-up rings for the O-rings, and also means for compressing the O-rings.

SUMMARY

An object of my invention is to provide a semiconductor rectifier assembly that has a relatively high explosion rating but does not require the O-rings, the back-up rings, and the O-ring compressing means referred to in the immediately preceding paragraph.

Another object is to attain a relatively high explosion rating without requiring any supplementary gas-confining enclosure around portions of the wafer-enclosing housing of the semiconductor rectifier assembly.

Still another object is to provide simple and inexpensive means for protecting the sheet metal sealing members of the housing from being damaged by any arc initiated at the edge of the semiconductor wafer.

In carrying out in my invention in one form, I provide two spaced-apart electroconductive posts having facing surfaces and a semiconductor body located between said facing surfaces and electrically in series with said posts. Enclosing said semiconductor body is a sealed housing comprising said posts, a generally cylindrical hollow insulator surrounding in radially spaced relationship the semiconductor body and the portions of the posts adjacent the semiconductor body, and sealing means at opposite ends of the cylindrical insulator for respectively forming seals between the posts and the ends of the insulator. The sealing means at one end of the insulator comprises first and second metal flanges joined together at their outer peripheries. The first flange is bonded adjacent its inner periphery to the insulator, and the second is bonded adjacent its inner periphery to the adjacent post. Between said flanges, there is positioned a thin annular disc of an electrical insulating material capable of evolving gases when exposed to an arc. This insulating disc has a portion that extends between the inner periphery of the cylindrical insulator and the adjacent post, and the disc covers the entire internal surface portion of the second flange that extends between the inner periphery of the insulator and the adjacent post. The gases evolved by the disc when an arc is nearby oppose motion of the arc onto the metal flanges, thereby protecting the flanges from the arc.

BRIEF DESCRIPTION OF DRAWING

The single FIGURE of the drawing is a side elevational view, in section, of a high-power semiconductor rectifier assembly that embodies one form of my invention.

DETAILED DESCRIPTION OF PREFERRED EMBODIMENT

The rectifier assembly shown in the drawing will now be described in detail, with the understanding that except where otherwise indicated below, a plan (horizontal) view of the assembly would reveal that its various parts are circular.

Referring now to the drawing, the rectifier assembly shown therein comprises a disc-like body 12 sandwiched between two spaced-apart electroconductive thrust members, or posts, 14 and 15. The posts have facing surfaces 16 and 17 that are flat and are substantially parallel to each other. Between the lower surface 16 of the upper post and the body 12 there is a strain buffer 20, preferably in the form of a thin disc of a suitable metal, such as tungsten or molybdenum, having flat surfaces on its opposite sides. One such surface contacts the post surface 16 and the other contacts the upper surface of disc-like body 12. The strain buffer is not a part of my invention and in certain applications can be omitted altogether so that the surface 16 of the post 14 directly contacts the disc-like body 12.

The disc-like body 12 comprises a thin relatively broad-area, circular wafer 22 of asymmetrically conductive silicon and a thicker disc-like substrate 24 of a suitable metal, such as molybdenum or tungsten, to the top of which the wafer is suitably joined. The body 12 can be constructed by any one of a number of different techniques that are well known in the art. Internally, the silicon wafer 22 will have at least one broad-area PN rectifying junction generally parallel to its faces. The device shown for illustration purposes is a diode, and its wafer is therefore characterized by two layers, one of P-type and the other N-type conductivity. Assuming that the P-layer is ohmically connected to the metal substrate 24, the forward direction of conventional current through the body 12 is upwardly as viewed in the drawing. A protective coating 25 of insulation (e.g., silicone rubber) is deposited on the upper face of the body 12 adjacent to the outer periphery of the wafer 22 and serves to encapsulate this outer periphery of the silicon wafer. It will be noted that the substrate 24 projects radially outward beyond the outer periphery of the wafer 22.

It is conventional to mount the subassembly shown in the drawing in a pressure assembly (not shown) that acts to force the posts 14 and 15 toward each other, thereby sandwiching the disc-like body 12 under pressure between the posts. The posts serve as combined electrical and thermal conductors. Electric current flows in series through lower post 15, disc-like body 12, strain buffer 20, and upper post 14. The heat developed by the current in passing through the body 12 is conducted by the posts 14 and 15 to opposite ends of the subassembly and from there to suitable heat sinks (not shown) for transfer to the surrounding ambient.

For protecting the wafer 22 and adjacent parts from the surrounding ambient, a sealed housing 30 is provided in which the disc-like body 12 is located. This sealed housing comprises a generally cylindrical hollow insulator 32, preferably of a ceramic material, surrounding in radially spaced relationship the disc-like body 12 and those portions of the posts 14 and 15 located adjacent the disc-like body 12. The housing further comprises the posts 14 and 15 themselves and sealing means 34 and 36 at axially opposed ends of the insulating cylinder 32 for respectively forming seals between said posts and the ends of said insulating cylinder.

The sealing means 34 at the upper end of the insulator 32 comprises two annular metal flanges 38 and 40 joined together by welding, preferably cold welding, at their outer peripheries to form a hermetic seal between the flanges. These flanges are preferably of copper and of a relatively thin sheet material. Lower flange 38 comprises two radially extending portions 45 and 46 and an axially extending cylindrical portion 47 interconnecting the radially extending portions 45 and 46. Portion 45 of lower flange 38 is bonded to the flat end surface of ceramic insulator 32 by a conventional ceramic-to-metal seal. The upper flange 40 comprises two radially extending portions 51 and 52 and an axially extending cylindrical portion 53 interconnecting portions 51 and 52 and nested within the other cylindrical portion 47. Portion 51 contains an axially extending lip 56 at its inner periphery that is suitably brazed to the outer periphery of post 14 to form a hermetic seal between post 14 and the upper flange 40.

The sealing means 36 at the lower end of the insulator 32 comprises a ring 60 of generally U-shaped cross section. The radially outer portion of ring 60 is hermetically sealed to the lower portion of insulator 32 by a suitable ceramic-to-metal seal, and the radially inner portion of ring 60 is hermetically sealed to post 15 by a suitable brazed joint.

The sealed housing 30 comprising parts 14, 15, 34, 36 and 32 is filled with a relatively inert gas, such as nitrogen, having a slight positive pressure with respect to the surrounding ambient, thus protecting the parts within the housing from oxidation and other types of chemical reaction, especially when at elevated temperature.

For centering the disc-like body 12 within the housing so as to assure proper engagement between parts 14, 20, 12, and 15, a ring 62 of generally L-shaped cross-sectional form and of a suitable insulating material such as silicone rubber is provided. This ring 62 has an axially extending portion 64 surrounding the disc-like body 12 and the upper end of lower post 15. A radially extending portion 66 of the ring 62 extends along the upper face of the outer peripheral portion of disc-like body 12. The inner periphery of portion 66 of ring 62 serves to center the strain buffer 20 during assembly of the rectifier device.

In operation, the device that has been described hereinbefore can safely conduct in a forward sense high magnitudes of steady state current and, for relatively short periods of time, even much higher magnitudes of surge current. Nevertheless, as was noted in the introductory portion of this specification, a rectifier device may sometime be subjected to an abnormal condition (for example, a surge of current exceeding its maximum capability) that causes it to permanently fail. This failure mode is a short circuit through the silicon body 12; and the external electric circuit will ordinarily include suitable protective means (such as an electric fuse, not shown) to isolate the failed device, which can then be replaced by a new one. While the protective means takes only a short time successfully to complete its isolating function, a substantial amount of current can be let through during that time. Consequently, in the event an arc occurs near the edge of the body 12, there is a real possibility that it will quickly become so intense as to burn a hole through or otherwise perforate the relatively thin portions of one of the terminal members, thereby allowing sparks, or flame, or other hot arcing products to escape from the housing. Such escaping hot arcing products could endanger the soundness of other equipment located in the vicinity.

In accordance with one form of my invention, the explosion rating of such an assembly is significantly increased by positioning a thin annular disc 70 of electrical insulating material between the flanges 38 and 40 of the upper sealing means 34. This disc 70 has a first portion 70a adjacent its outer periphery disposed between the two flanges. A second portion 70b of the disc located radially inwardly of the first portion extends between the inner periphery of the cylindrical insulator 32 and the adjacent post 14. This second portion 70b of the disc covers the entire surface portion of the upper flange 40, including lip 56, that is internal to the sealed housing and extends between the inner periphery of the insulated housing and the post 14. The disc 70 is of a flexible material, preferably glass cloth impregnated and coated with polytetrafluoroethylene. The flexibility of the disc material allows its portion 70b to assume a generally conical shape thereby covering the exposed surface of lip 56.

The precise manner in which the insulating disc 70 protects the upper sealing means 34 immediately following arc-initiation at the edge of the wafer is not fully understood, but it is believed to be related to the ability of the disc to impede upward motion of an arc terminal into the immediate region of the sealing structure. In this respect, the polytetrafluorethylene of the disc 70, when heated by the hot arcing products, ablates and evolves electronegative gases. These evolving gases are believed to exert a downward pressure on the arc during the crucial brief period in question, thus discouraging upward motion of the arc. Such an arc will have its lower terminal on the metal substrate 24 and its upper terminal on the strain buffer 20 or on the outer periphery of post 14. If the upper terminal can be maintained on such parts during the brief period required for arc-extinction, damage to the sealing means is unlikely. But if the upper arc terminal reaches the sealing means 34, it will quickly burn a hole through or otherwise perforate the thin metal of the sealing means. Such perforation would, of course, allow hot arcing products to escape from the sealed housing, which is a result that I am seeking to prevent.

If the upper arc terminal were to reach the lower flange 45 of the upper sealing means 34, a U-shaped current path would be present through the sealing means, with the lower flange 38 constituting one arm of the U and the upper flange 40 constituting the other. This would result in repulsive magnetic forces being developed between the arms, which forces could rupture the cold weld between the flanges. It is therefore important that the upper arc terminal not reach the flange 38. The gas-evolving properties of the disc 70 and the downward protrusion of disc portion 70b into the path of an upwardly moving arc are factors tending to impede arc-motion onto flange 38.

For shielding the inside surface of the insulator 32 from any arc initiated at the outer periphery of the wafer 22, thereby reducing chances for the arc to crack the insulator, a thin liner 80 is provided for the insulator 32. This liner is preferably of the same glass-fiber polytetrafluoroethylene material as the annular disc 70. The liner covers the entire internal surface of the insulator 32 that is within the sealed housing. Such a liner for an insulator such as 32 has been used and disclosed prior to my invention, for example, in the aforesaid Piccone et al. patent.

Tests have shown that the presence of the insulating disc 70 enables one to increase the explosion rating of a rectifier assembly by about 10 to 20 percent as compared to an otherwise substantially identical assembly having no such disc but having the liner 80.

It has also been shown through tests that an arc initiated at the edge of the wafer 22 has much less tendency to damage the sealing means 36 than the sealing means 34 at the substrate side of the wafer. This arc initially has one terminal on metal substrate 24 and its other on the opposite side of the wafer 22. It appears that the arc terminal on the substrate has much less mobility than the opposite arc terminal and, thus, a much-reduced tendency to move onto the adjacent sealing means 36. Accordingly, in a preferred form of the invention, I apply the protective disc 70 to only the sealing means 34 located on the wafer side of the substrate 24.

While I have shown and described a particular embodiment of my invention, it will be obvious to those skilled in the art that various changes and modifications may be made without departing from the invention in its broader aspects; and I, therefore, intend in the appended claims to cover all such changes and modifications as fall within the true spirit and scope of my invention.

What I claim as new and desire to secure by Letters Patent of the United States is:

1. In a semiconductor rectifier assembly:
   (a) first and second spaced-apart electroconductive posts having facing surfaces,
   (b) a semiconductor body disposed mechanically between said facing surfaces and electrically in series with said posts,
   (c) a sealed housing for said semiconductor body comprising: said posts, a generally cylindrical hollow insulator surrounding in radially spaced relationship said semiconductor body and those portions of said posts located adjacent to said semiconductor body, and sealing means located at axially opposed ends of said cylindrical insulator for respectively forming seals between said posts and said ends of said insulator,
   (d) said sealing means at one end of said insulator comprising a pair of annular metal flanges joined together at their outer peripheries, a first one of said flanges being bonded adjacent its inner periphery to said insulator and a second one of said flanges being bonded adjacent its inner periphery to the adjacent post, and
   (e) a thin annular disc of electrical insulating material having a first portion adjacent its outer periphery disposed between one end of said insulator and said second metal flange and a second portion located radially inwardly of said first portion extending between the inner periphery of said cylindrical insulator and said adjacent post, said insulating material being of a type that evolves gases when exposed to an arc.

2. The semiconductor rectifier assembly of claim 1 in which said disc of insulating material covers the entire surface portion of said second flange that is internal to said housing and extends between the inner periphery of said insulator and said adjacent post.

3. The semiconductor rectifier assembly of claim 1 in which:
   (a) said insulator has an internal, generally cylindrical surface extending between its opposite ends, and
   (b) a thin tubular liner of electrical insulating material is provided for said insulator covering substantially all of said internal generally cylindrical surface.

4. The semiconductor rectifier assembly of claim 1 in which said disc is of a material comprising polytetrafluoroethylene.

5. The semiconductor rectifier assembly of claim 1 in which said disc is of a material comprising glass fibers coated with polytetrafluoroethylene.

6. The semiconductor rectifier assembly of claim 1 in which:
   (a) said second flange has a short annular lip at its inner periphery that extends toward said semiconductor body, and
   (b) said second portion of said disc is generally conical so as to cover said lip and be positioned between said lip and said semiconductor body.

7. The semiconductor rectifier assembly of claim 1 in which:
   (a) said first flange has a radially inner portion bonded to an end surface of said insulating housing and located entirely radially outwardly of the inner periphery of said cylindrical housing and
   (b) said second portion of said disc is generally conical and extends axially of said insulator from said first portion of the disc toward said semiconductor body.

8. The rectifier assembly of claim 1 in which:
   (a) said semiconductor body is a wafer of semiconductor material joined to a disc-like metal substrate that projects radially outward beyond the outer periphery of said wafer,
   (b) said first sealing means is located at the same side of said substrate as said wafer.

9. The rectifier assembly of claim 1 in which said first portion of said annular disc is located between said metal flanges.

10. The rectifier assembly of claim 2 in which said first portion of said annular disc is located between said metal flanges.

* * * * *